(12) United States Patent
Simmonds

(10) Patent No.: US 11,755,274 B2
(45) Date of Patent: Sep. 12, 2023

(54) HYBRID INPUT NETWORKED AUDIO SUBWOOFER

(71) Applicant: Lenbrook Industries Limited, Pickering (CA)

(72) Inventor: Matthew Simmonds, Toronto (CA)

(73) Assignee: Lenbrook Industries Limited, Pickering (CA)

( * ) Notice: Subject to any disclaimer, the term of this patent is extended or adjusted under 35 U.S.C. 154(b) by 0 days.

(21) Appl. No.: 17/411,387

(22) Filed: Aug. 25, 2021

(65) Prior Publication Data
US 2023/0062252 A1  Mar. 2, 2023

(51) Int. Cl.
*H04R 3/00* (2006.01)
*H03F 3/183* (2006.01)
*G06F 3/16* (2006.01)
*H03G 3/30* (2006.01)

(52) U.S. Cl.
CPC ............. *G06F 3/162* (2013.01); *H03F 3/183* (2013.01); *H03G 3/3005* (2013.01); *H04R 3/00* (2013.01); *H03F 2200/03* (2013.01); *H03G 2201/103* (2013.01); *H04R 2420/07* (2013.01); *H04R 2420/09* (2013.01)

(58) Field of Classification Search
CPC ...... G06F 3/162; H03F 3/183; H03F 2200/03; H03G 3/3005; H03G 2201/103; H04R 3/00; H04R 2420/07; H04R 2420/09
USPC .......................................................... 381/77
See application file for complete search history.

(56) References Cited

U.S. PATENT DOCUMENTS

| | | | |
|---|---|---|---|
| 7,653,344 B1* | 1/2010 | Feldman | H04H 20/61 455/3.06 |
| 10,853,023 B2 | 12/2020 | Millington et al. | |
| 2005/0261789 A1 | 11/2005 | Chen | |
| 2005/0273188 A1* | 12/2005 | Barwicz | H04R 3/00 700/94 |
| 2017/0085991 A1* | 3/2017 | Yao | H03F 1/02 |
| 2017/0220315 A1* | 8/2017 | Lin | H04R 27/00 |
| 2019/0208304 A1* | 7/2019 | Cohen | H04R 1/1075 |
| 2020/0107117 A1* | 4/2020 | Vansickel | H03F 3/183 |
| 2021/0058266 A1 | 2/2021 | Shoesmith et al. | |
| 2022/0156035 A1* | 5/2022 | Liu | G10L 25/90 |

FOREIGN PATENT DOCUMENTS

CN   202259809 U   5/2012

OTHER PUBLICATIONS

Heos Subwoofer: Denon: 11 pages (2022).
Sub (Gen3): Sonos, Inc.: 12 pages (2022).
Anon, "Audio Connection". Vendor's website, Jun. 15, 2021 (Jun. 15, 2021), [online] [retrieved on Dec. 9, 2022 (Sep. 12, 2022)]. Retrieved from the Internet:<https://web.archive.org/web/20210615105214/https://audioconnection.com.au/collections/bluesound>.

(Continued)

*Primary Examiner* — Carolyn R Edwards
*Assistant Examiner* — Friedrich Fahnert
(74) *Attorney, Agent, or Firm* — Erik A. Huestis; Sameer K. Pai; Foley Hoag LLP

(57) ABSTRACT

A hybrid input networked subwoofer includes a traditional line-in analog audio input for receiving analog audio content from non-networked audio source devices together with wired and/or wireless network interfaces for receiving digital audio content from one or more networked audio devices.

18 Claims, 3 Drawing Sheets

(56) References Cited

OTHER PUBLICATIONS

Anon., "24-BIT, 96-kHz Stereo A/D Converter With 6 × 2-Channel MUX and PGAE", Manufacturer's Website, Mar. 2006 (Mar. 2006), [online] [retrieved on Dec. 12, 2022 (Dec. 12, 2022)]. Retrieved from the Internet: <https://www.ti.com/lit/gpn/pcm1851a >.

Anon., "Pulse Sub+ Wireless Powered Subwoofer", Manufacturer's Website, Sep. 25, 2020 (Sep. 25, 2020), [online] [retrieved on Dec. 12, 2022 (Dec. 12, 2022)]. Retrieved from the Internet: <https://web.archive.org/web/20200925095443/https://www.bluesound.com/products/pulse-subwoofer/ >.

International Search Report and Written Opinion for Application No. PCT/1132022/000477 dated Jan. 25, 2023.

\* cited by examiner

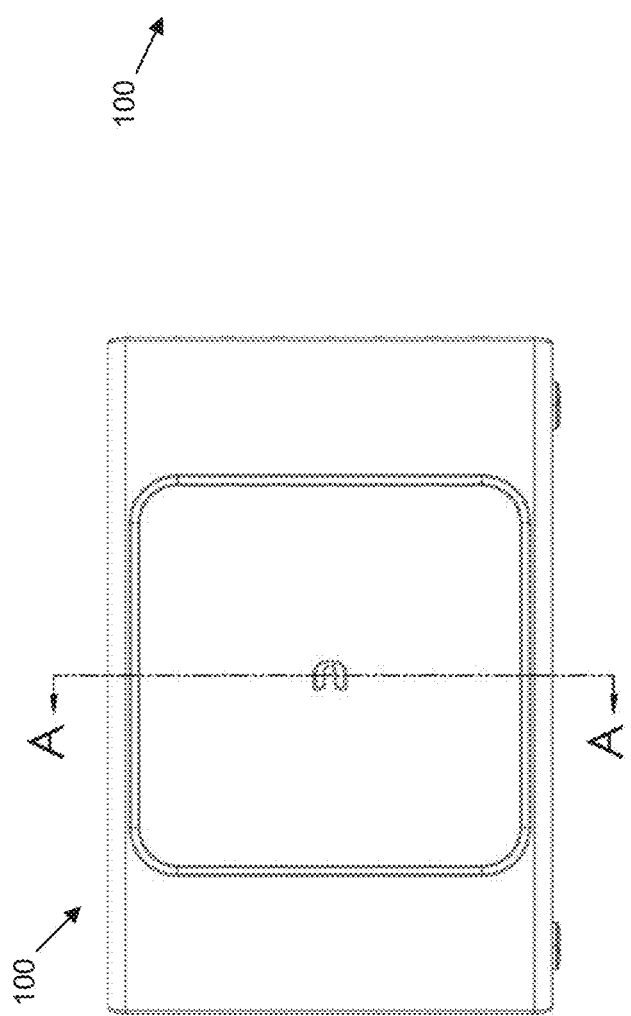
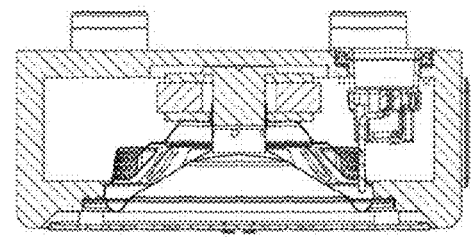
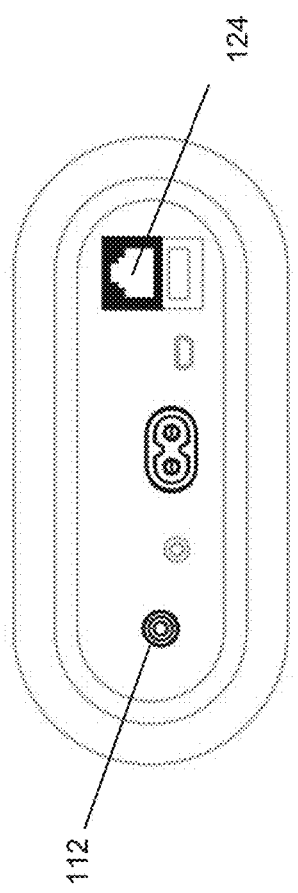
FIG. 1A
SECTION A-A
FIG. 1B
FIG. 1C

HYBRID INPUT NETWORKED AUDIO SUBWOOFER

BACKGROUND

The present application relates generally to audio systems and, more particularly, to subwoofers that can be paired with full-range speaker systems.

Subwoofers are specialized audio loudspeaker systems designed specifically for efficiently rendering low-frequency acoustic signals, typically below 200 Hertz (Hz). Subwoofers have existed for many years as passive speaker systems with large (i.e., 8 inch or larger diameter) single or multiple drivers and were driven with external audio power amplifiers. Modern subwoofer systems are typically active and include an integrated audio amplifier with controls dedicated to adjusting the volume output level and phase of the rendered audio relative to the main full-range speaker system they are paired with. More recently, with the popularity of domestic audio systems that pull audio directly from home networks (both WiFi and wired Ethernet Local Area Networks (LANs)), advanced network subwoofers have been made available at reasonable cost. These typically feature one or more wired (Ethernet) network ports with optional WiFi network connectivity ports. Specialized real-time embedded software allows both the subwoofer and its associated full-range loudspeaker system to render a common audio signal in synchrony.

As technologically sophisticated as these networked subwoofer systems are, they cannot be connected to traditional non-networked audio source devices (e.g., audio-video receivers and two-channel integrated audio amplifiers), which only include analog subwoofer output connections. Customers often upgrade their audio video equipment gradually and may choose to first invest in a network-capable subwoofer. An advanced networked subwoofer may initially appear as a practical choice assuming they could connect it to their existing non-networked analog audio equipment (e.g., an audio-video receiver). However, customers become frustrated when they realize a networked subwoofer (which they would prefer as a contemporary 'future-proof' solution) is unusable unless they immediately commit to replacing all of their existing analog audio-video equipment with new networked equipment that is compatible with the networked subwoofer.

BRIEF SUMMARY OF THE DISCLOSURE

In accordance with one or more embodiments, a hybrid input networked audio subwoofer device is disclosed. The subwoofer devices includes a subwoofer driver mounted in an enclosure capable of rendering acoustic signals in the low-frequency effects (LFE) channel. A line-in analog audio input port in the enclosure is configured to be connected by a cable to audio equipment with a line-out analog audio connector to receive analog audio content from the audio equipment. An analog-to-digital converter (ADC) device in the enclosure is coupled to the line-in analog audio input port for converting the analog audio content to a digital audio signal. A network interface receives a second digital audio signal from one or more networked audio devices. A digital signal processor is coupled to the ADC device and to the network interface for receiving and processing a selected one of the digital audio signal from the ADC device or the second digital audio signal from the one or more networked audio devices to generate a digital audio output. A digital amplifier is coupled to the digital signal processor and the subwoofer driver for converting the digital audio output to an analog signal at a given power level to be rendered by the subwoofer driver.

In accordance with one or more embodiments, a method is disclosed for rendering acoustic signals in a low-frequency effects (LFE) channel from a selected one of an analog audio source or a networked digital audio source. Rendering the acoustic signals from the analog source comprises: (a) receiving analog audio content from the analog audio source at a line-in analog audio input port of a hybrid input networked audio subwoofer device; (b) converting the analog audio content to a digital audio signal; (c) processing the digital audio signal to generate a digital audio output; (d) converting the digital audio output to an analog audio output at a given power level; (e) rendering the amplified analog audio output by a subwoofer driver. Rendering the acoustic signals from the digital source comprises: (a) receiving digital audio content from the networked digital audio source at a network interface of the hybrid input networked audio subwoofer; (b) processing the digital audio content to generate a digital audio output; (c) converting the digital audio output to an analog audio output at an amplified power level; (d) rendering the analog audio output by a subwoofer driver.

BRIEF DESCRIPTION OF THE DRAWINGS

FIGS. 1A-1C illustrate an exemplary networked subwoofer with an analog audio line input connection in accordance with one or more embodiments.

Like or identical reference numbers are used to identify common or similar elements.

DETAILED DESCRIPTION

Various embodiments disclosed herein relate to a hybrid input networked subwoofer that includes a traditional analog audio line input connection together with wired and/or wireless network connectivity.

FIGS. 1A-1C illustrate an exemplary hybrid input networked subwoofer 100 in accordance with one or more embodiments. FIG. 1A shows a front view of the subwoofer 100. FIG. 1B is a cross-section view taken along lines A-A of FIG. 1A. FIG. 1C shows a rear panel of the subwoofer device 100 featuring several electrical connectors, as further discussed below.

Figure 2:
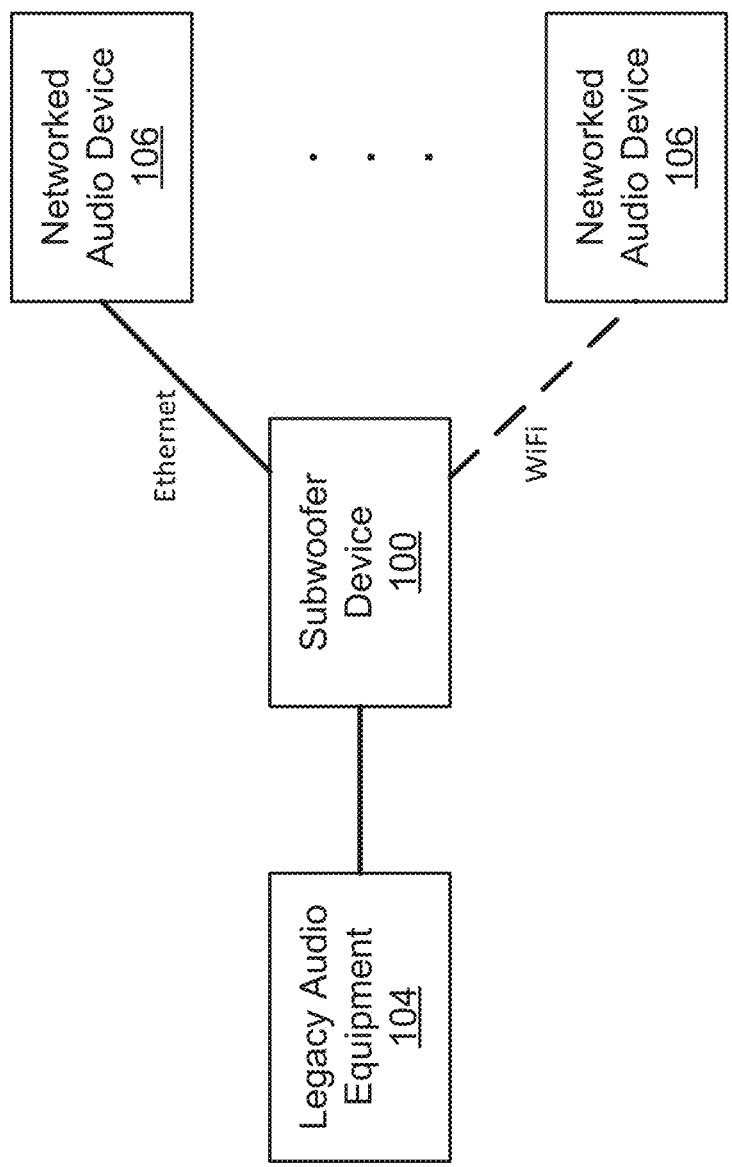
FIG. 2 is a block diagram illustrating connection of the networked subwoofer in a sound system in accordance with one or more embodiments.

The hybrid input networked subwoofer 100 can be connected to legacy non-networked analog audio equipment 104 as well as more modern networked audio devices 106 through Ethernet and/or WiFi connections as shown in FIG. 2.

The Pulse Sub+™ networked subwoofer offered by Lenbrook is one example of a hybrid input networked subwoofer, which is fully compatible with legacy non-networked audio equipment. Such non-networked audio equipment includes, e.g., many existing audio/video receivers with line-out analog audio connectors for direct wiring to conventional analog input subwoofers. Many other categories of popular legacy audio devices include such line-out connectors also compatible with networked subwoofers in accordance with various embodiments including, e.g., 2-channel preamplifiers, surround sound processors and integrated 2-channels audio amplifiers. With the addition of a line-in analog audio input, users of the hybrid input networked subwoofer 100 can continue to enjoy the use of their existing legacy audio equipment without the need to be forced into buying an entire networked audio system. They can enjoy the excellent audio performance of a networked subwoofer (with state-of-the-art digital audio processing) while waiting to upgrade their legacy analog audio equipment to networked components as their budget allows.

Figure 3:
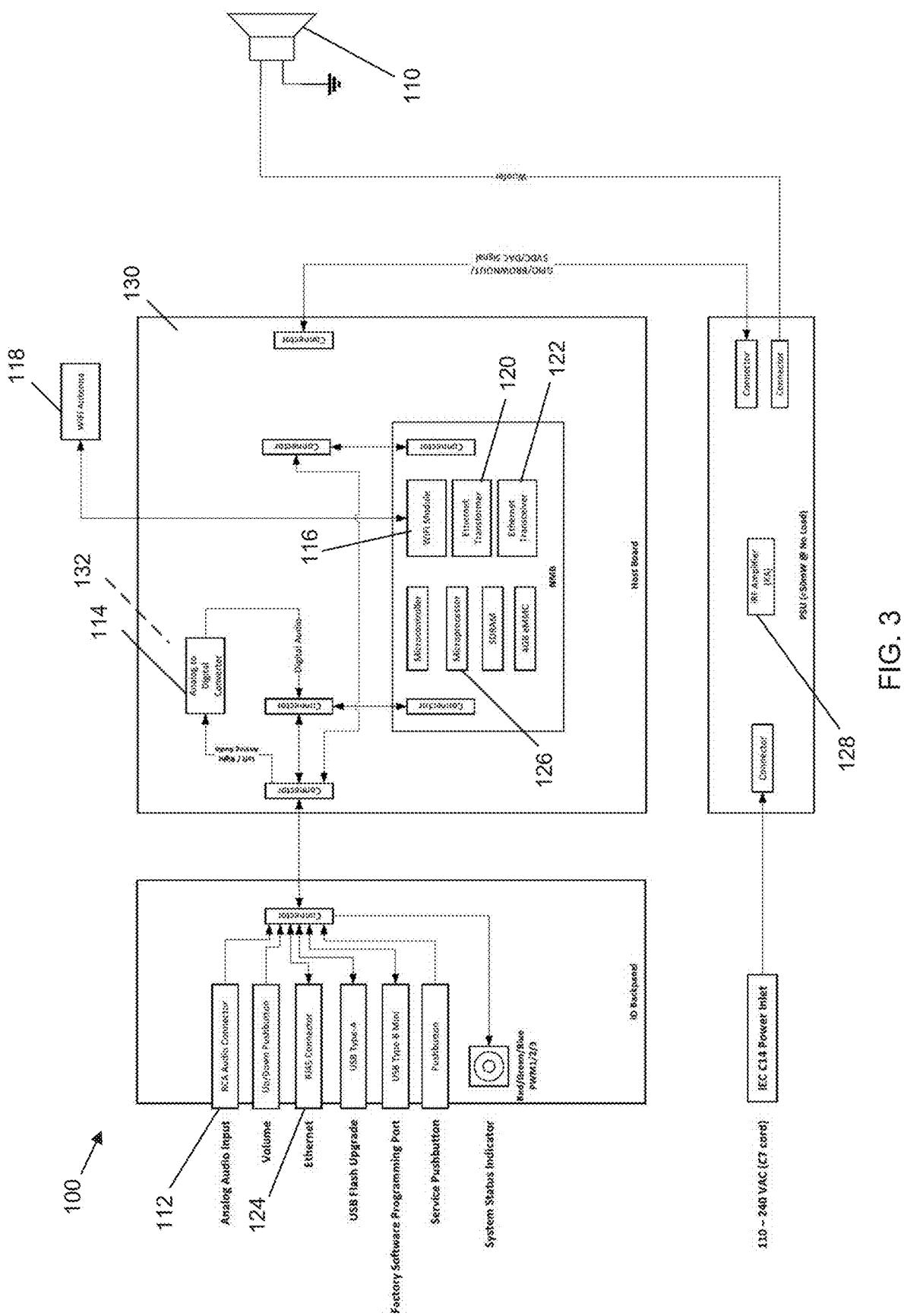
FIG. 3 is a block diagram illustrating an exemplary system architecture of the networked subwoofer in accordance with one or more embodiments.

FIG. 3 is a block diagram illustrating an exemplary system architecture of the hybrid input networked subwoofer device 100 in accordance with one or more embodiments. The subwoofer device 100 includes a subwoofer driver 110 mounted in the device enclosure 112. The subwoofer driver 110 is capable of rendering acoustic signals in the low-frequency effects (LFE) channel.

The subwoofer device 100 includes a line-in analog audio input port 112 configured to be connected by a cable to legacy audio equipment 104 with a line-out analog audio connector to receive analog audio content from the audio equipment 104. An analog-to-digital converter (ADC) 114 converts the analog audio content received at the line-in analog audio input port 112 to a digital audio signal.

The subwoofer device 100 includes wired and wireless network interfaces capable of receiving digital audio content from the networked audio devices 106. A WiFi module 116 processes digital audio signals received at a WiFi antenna 118. Other wireless network interfaces are also possible including, e.g., a Bluetooth network interface. An Ethernet transformer 120 and transceiver 122 process digital audio signals received at an Ethernet port 124.

A digital signal processor (DSP) 126 processes digital signals received either from the ADC or the WiFi or Ethernet interfaces, and generates a digital audio output.

A digital amplifier 128 accepts the digital audio output directly from the DSP 126 and converts it to an analog electrical signal at a power level appropriate for providing to the subwoofer driver 110.

The DSP 126 can perform signal processing including, e.g., audio frequency equalization to linearize the subwoofer driver and the cabinet's inherently uneven audio output across its frequency range. It can also perform loudspeaker driver excursion control and protection to prevent damage to the driver at high level audio outputs.

The ADC 114 can comprise an advanced single-chip analog-to-digital converter device with an integrated programmable gain amplifier (PGA). The ADC 114 is selected to provide low-cost and high-performance matching of audio levels with the connected legacy audio source equipment 104. The ADC 114 also features capability for either differential or single-ended analog audio signal types, thus allowing the subwoofer platform to be modified for applications where differential signal types are required (e.g., commercial audio system environments where long cable runs indicate the need for enhanced noise rejection over single-ended audio signal types typically employed in smaller residential settings). The ADC 114 features a digital audio output compatible with advanced DSP hardware. As the DSP system 126 also manages audio received from networked audio devices 106, analog audio signals received from legacy audio equipment 104 benefit from the same quality of audio processing as the networked devices 106.

The rear panel of the subwoofer device 100 (FIG. 1C) features several electrical connectors, including the line-in analog audio input port 112, which can be a female stereo 'RCA' connector for connection to external analog audio source devices (e.g., soundbars or legacy audio video receivers).

In one or more embodiments, the RCA female connector includes an integrated micro-switch, which is actuated when a male RCA plug from the legacy equipment is inserted. Software executing on the DSP 126 continually monitors the actuation status of the micro-switch. In the event that an RCA plug is inserted into the female connector, the software enables its analog audio signal-monitoring feature. If the signal-monitoring software detects an audio signal level at the subwoofer's input 112 with an average signal value SA greater than a threshold Tr for a duration of time Dx seconds, the software automatically selects the RCA analog input and deselects reception of audio data from the Ethernet and WiFi connectors. In this system state, the subwoofer's audio power amplifier is turned on allowing it to render audio received from the analog audio input. If the average audio signal value SA at the RCA connector's falls below threshold Tr for longer than time Dy seconds, the software's signal monitoring feature deselects the analog audio input and re-selects reception of audio data from the Ethernet or WiFi connectors. This automatic input selection simplifies the use of the hybrid input software, as no manual intervention is required from a remote control device or other user interface apparatus for the subwoofer to select the currently active audio source.

The subwoofer device 100 includes both complex high-speed digital circuitry and analog audio input circuitry collocated on common printed circuit board assemblies (PCBAs) 130. This potentially makes the ADC 114 susceptible to digital noise induced from the adjacent high-speed digital circuitry. To reduce the induced digital noise to an inaudible level, the PCBA is designed with relatively large areas of copper 'ground planes' 132 underneath and around the ADC circuit. This large copper ground plane reduces the impedance of the electrical path for any noise in the vicinity of the ADC circuit so that any undesired electrical noise is returned to the system ground, rather than affecting the ADC circuit's conversion of the desired analog audio input signal.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions.

Accordingly, the foregoing description and attached drawings are by way of example only, and are not intended to be limiting.

The invention claimed is:

1. A hybrid input networked audio subwoofer device, comprising:
    an enclosure;
    a subwoofer driver mounted in the enclosure capable of rendering acoustic signals in the low-frequency effects (LFE) channel;

a line-in analog audio input port in the enclosure configured to be connected by a cable to audio equipment with a line-out analog audio connector to receive analog audio content from the audio equipment, wherein the line-in analog audio input port comprises an RCA female connector with an integrated micro-switch that is actuated when a male RCA plug of the cable is inserted in the RCA female connector, and wherein the hybrid input networked audio subwoofer device automatically selects the analog audio content received at the line-in analog audio input port for processing when the integrated micro-switch is actuated;

an analog-to-digital converter (ADC) device in the enclosure coupled to the line-in analog audio input port for converting the analog audio content to a digital audio signal;

a network interface in the enclosure for receiving a second digital audio signal from one or more networked audio devices;

a digital signal processor (DSP) in the enclosure coupled to the ADC device and to the network interface for receiving and processing a selected one of the digital audio signal from the ADC device or the second digital audio signal from the one or more networked audio devices to generate a digital audio output; and a digital amplifier in the enclosure coupled to the digital signal processor and the subwoofer driver for converting the digital audio output to an analog signal at a given power level to be rendered by the subwoofer driver.

2. The hybrid input networked audio subwoofer device of claim 1, wherein the network interface comprises a wired network interface.

3. The hybrid input networked audio subwoofer device of claim 1, wherein the network interface comprises an Ethernet port.

4. The hybrid input networked audio subwoofer device of claim 1, wherein the network interface comprises a wireless network interface.

5. The hybrid input networked audio subwoofer device of claim 1, wherein the network interface comprises a WiFi interface or a Bluetooth interface.

6. The hybrid input networked audio subwoofer device of claim 1, wherein the network interface comprises a wired network interface and a wireless network interface.

7. The hybrid input networked audio subwoofer device of claim 1, wherein the ADC device comprises single-chip analog-to-digital converter with an integrated programmable gain amplifier (PGA).

8. The hybrid input networked audio subwoofer device of claim 1, wherein the audio equipment comprises an audio/video receiver, a 2-channel preamplifier, a surround sound processor, a sound bar, or an integrated 2-channels audio amplifier.

9. The hybrid input networked audio subwoofer device of claim 1, wherein the LFE channel has a 3-120 Hz frequency range.

10. The hybrid input networked audio subwoofer device of claim 1, wherein the line-in analog audio input port comprises an RCA female connector.

11. The hybrid input networked audio subwoofer device of claim 1, wherein the ADC device and the digital signal processor are collocated on one or more common printed circuit board assemblies, and wherein the one or more common printed circuit board assemblies include copper ground planes underneath and/or around the ADC device.

12. A method of rendering acoustic signals in a low-frequency effects (LFE) channel from a selected one of an analog audio source or a networked digital audio source, wherein rendering the acoustic signals from the analog source comprises:

(a) receiving analog audio content from the analog audio source at a line-in analog audio input port of a hybrid input networked audio subwoofer device;

(b) converting the analog audio content to a digital audio signal;

(c) processing the digital audio signal to generate a digital audio output;

(d) converting the digital audio output to an analog audio output at a given power level;

(e) rendering the amplified analog audio output by a subwoofer driver;

wherein rendering the acoustic signals from the digital source comprises:

(a) receiving digital audio content from the networked digital audio source at a network interface of the hybrid input networked audio subwoofer;

(b) processing the digital audio content to generate a digital audio output;

(c) converting the digital audio output to an analog audio output at an amplified power level;

(d) rendering the analog audio output by a subwoofer driver (f) automatically detecting when a plug is inserted in the line-in analog audio input port and, in response, selecting the analog audio content received at the line-in analog audio input port to be rendered.

13. The method of claim 12, wherein the network interface comprises a wired network interface and/or a wireless network interface.

14. The method of claim 12, wherein the network interface comprises an Ethernet port.

15. The method of claim 12, wherein the network interface comprises a WiFi interface or a Bluetooth interface.

16. The method of claim 12, wherein the analog audio source comprises an audio/video receiver, a 2-channel preamplifier, a surround sound processor, a sound bar, or an integrated 2-channels audio amplifier.

17. The method of claim 12, wherein the LFE channel has a 3-120 Hz frequency range.

18. The method of claim 12, wherein the line-in analog audio input port comprises an RCA female connector.

* * * * *